(12) United States Patent
Thomas et al.

(10) Patent No.: US 9,661,758 B2
(45) Date of Patent: May 23, 2017

(54) METHODS OF SEGMENTED THROUGH HOLE FORMATION USING DUAL DIAMETER THROUGH HOLE EDGE TRIMMING

(71) Applicant: Sanmina Corporation, San Jose, CA (US)

(72) Inventors: Douglas Ward Thomas, Pacific Grove, CA (US); Shinichi Iketani, Sunnyvale, CA (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 14/463,588

(22) Filed: Aug. 19, 2014

(65) Prior Publication Data
US 2015/0047188 A1    Feb. 19, 2015

Related U.S. Application Data

(60) Provisional application No. 61/867,528, filed on Aug. 19, 2013.

(51) Int. Cl.
*H05K 3/10*  (2006.01)
*H05K 3/42*  (2006.01)
*H05K 3/00*  (2006.01)

(52) U.S. Cl.
CPC ........... *H05K 3/427* (2013.01); *H05K 3/0026* (2013.01); *H05K 3/0047* (2013.01);
(Continued)

(58) Field of Classification Search
CPC .. H05K 3/4623; H05K 3/4626; H05K 3/4635; H05K 3/4655; H05K 3/0061
See application file for complete search history.

(56) References Cited

U.S. PATENT DOCUMENTS

| 5,038,252 A * | 8/1991 | Johnson ............... H05K 1/0263 174/251 |
| 2006/0029726 A1* | 2/2006 | Mok ...................... H05K 3/462 427/96.1 |

(Continued)

FOREIGN PATENT DOCUMENTS

| JP | 2000174435 A | 6/2000 |
| JP | 2002111213 A | 4/2002 |
| JP | 2002346998 A | 12/2002 |

*Primary Examiner* — Minh Trinh
(74) *Attorney, Agent, or Firm* — Loza & Loza, LLP; Heidi L. Eisenhut

(57) ABSTRACT

Cost effective and efficient methods to maximize printed circuit board (PCB) utilization with minimized signal degradation are provided. The methods include electrically isolating a segmented via structure by controlling the formation of a conductive material within a plated via structure by utilizing different diameter drills within a via structure for trimming the conductive material at the via shoulder (i.e., the rim of a drilled two diameter hole boundary). The trimmed portion may be voided in the via structure for allowing electrically isolated plated through-hole (PTH) segments. One or more areas of trimmed rims within the via structure are used to form multiple stair like diameter holes to create one or more voids in the via structure. As a result, the formation of conductive material within the via structure may be limited to those areas necessary for the transmission of electrical signals.

10 Claims, 15 Drawing Sheets

(52) U.S. Cl.
CPC ............. *H05K 2201/09845* (2013.01); *H05K 2203/0207* (2013.01); *Y10T 29/49165* (2015.01)

(56) References Cited

U.S. PATENT DOCUMENTS

| | | | |
|---|---|---|---|
| 2006/0243481 A1* | 11/2006 | Bachar | H05K 1/0216 174/262 |
| 2006/0278429 A1* | 12/2006 | Tourne | H05K 3/0047 174/266 |
| 2008/0078572 A1 | 4/2008 | Watanabe et al. | |
| 2010/0001378 A1 | 1/2010 | DeNatale et al. | |
| 2015/0047188 A1* | 2/2015 | Thomas | H05K 3/427 29/852 |

\* cited by examiner

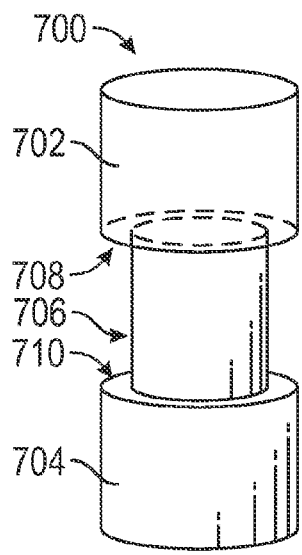
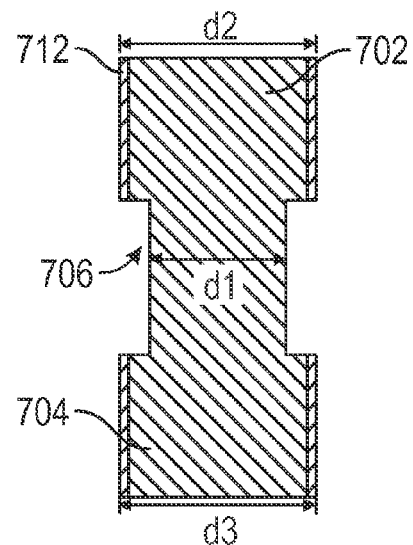
FIG. 7A  FIG. 7B
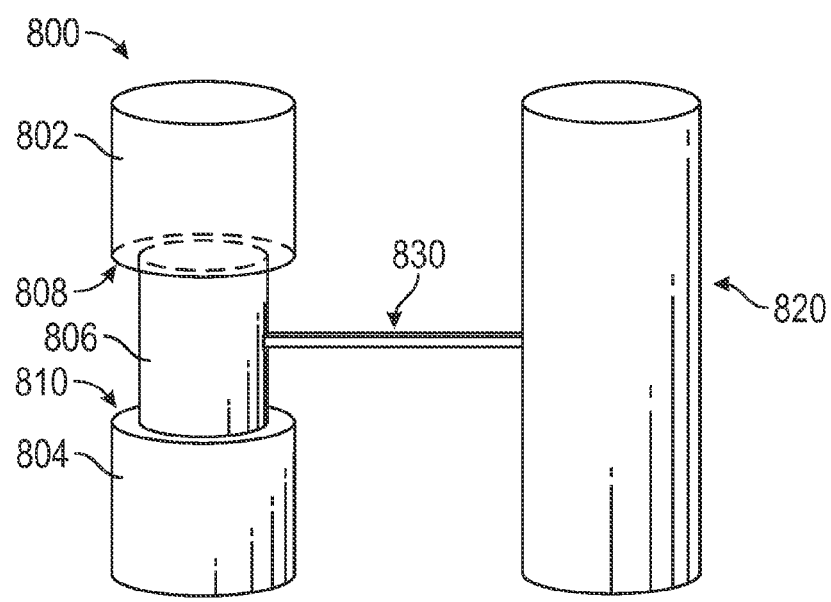
FIG. 8A

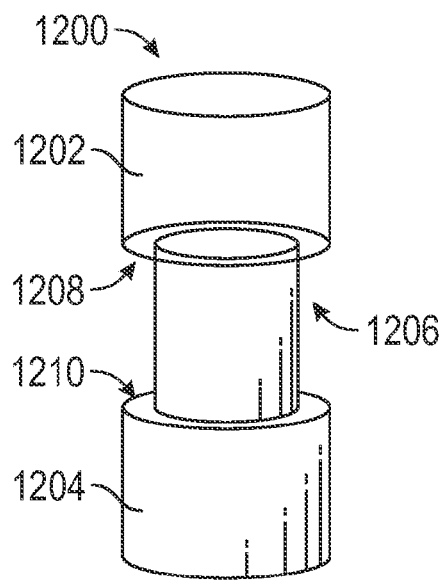
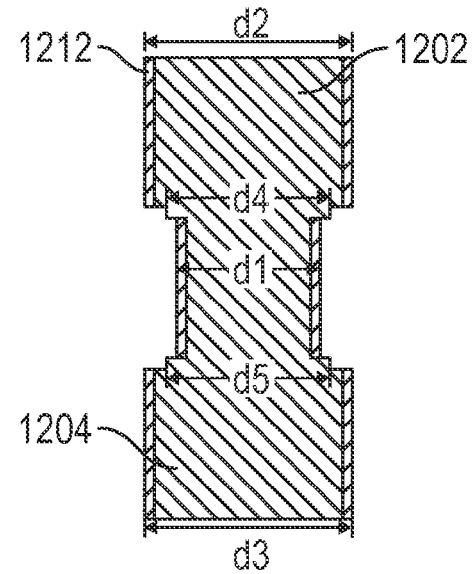
FIG. 12A  FIG. 12B
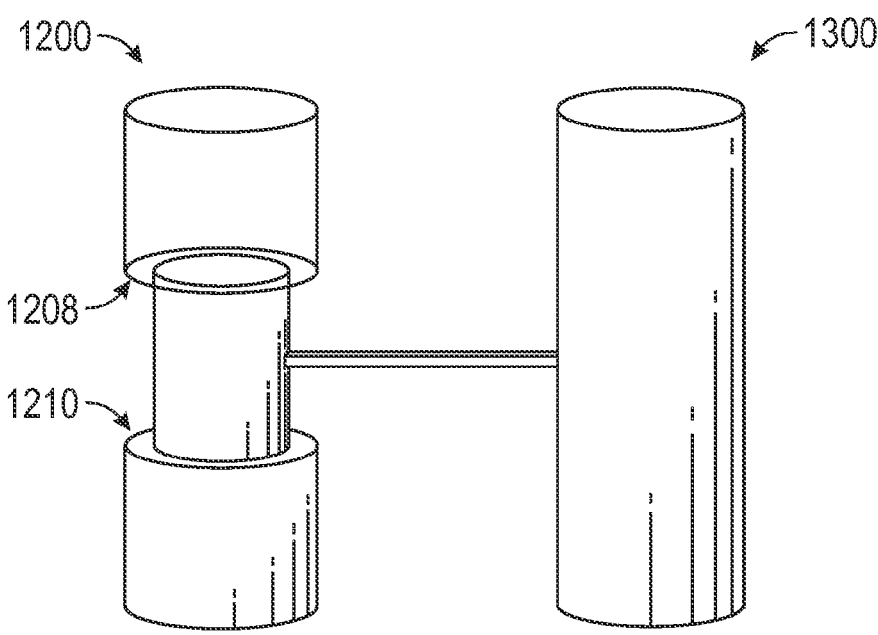
FIG. 13A

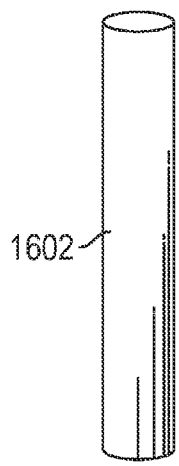 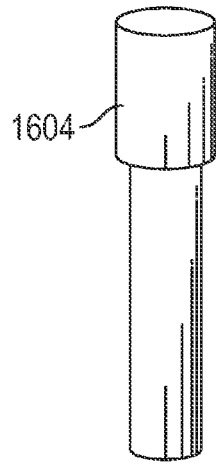 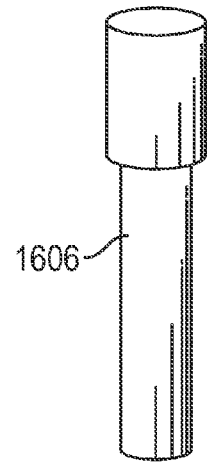 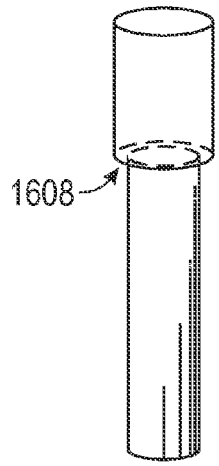
FIG. 16A     FIG. 16B     FIG. 16C     FIG. 16D
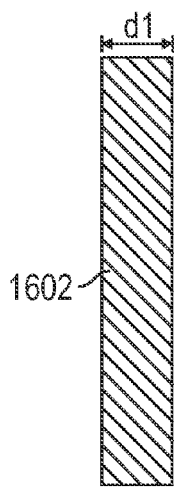 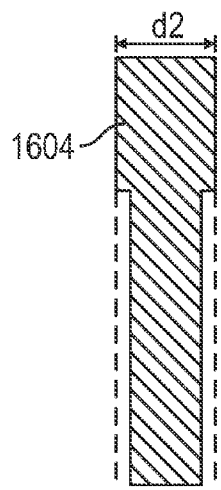 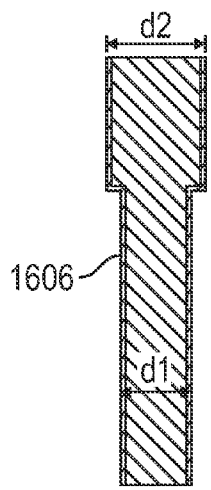 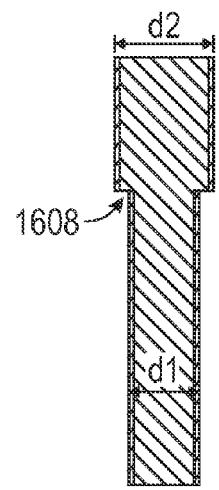
FIG. 17A     FIG. 17B     FIG. 17C     FIG. 17D

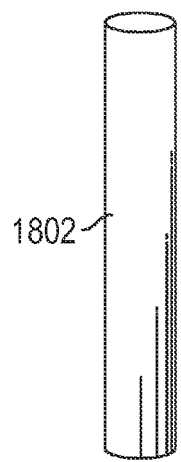 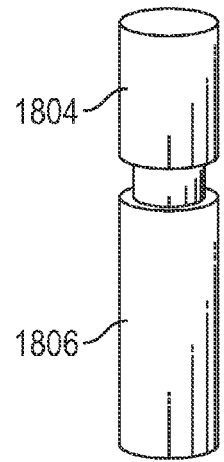 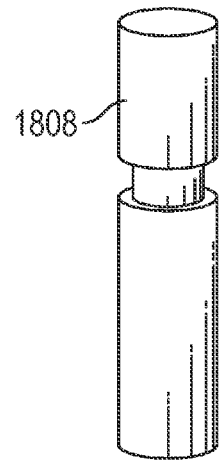 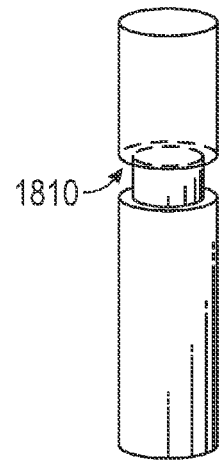
FIG. 18A    FIG. 18B    FIG. 18C    FIG. 18D
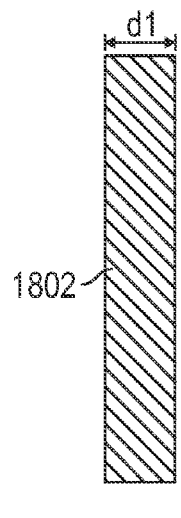 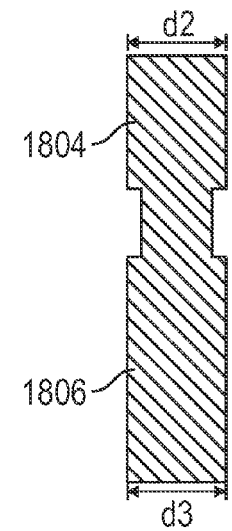 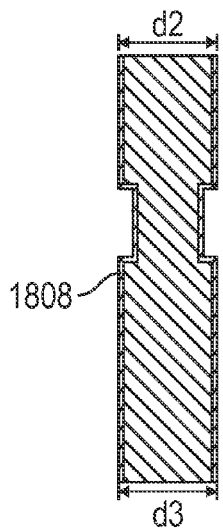 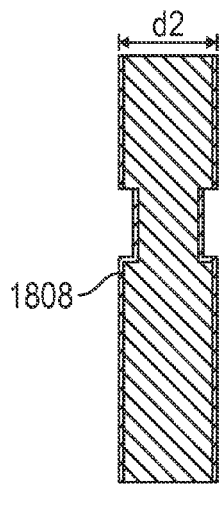
FIG. 19A    FIG. 19B    FIG. 19C    FIG. 19D

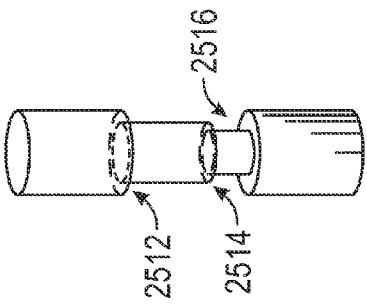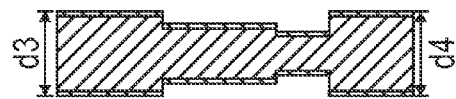

METHODS OF SEGMENTED THROUGH HOLE FORMATION USING DUAL DIAMETER THROUGH HOLE EDGE TRIMMING

CLAIM OF PRIORITY

The present Application for Patent claims priority to U.S. Provisional Application No. 61/867,528 entitled "Methods of Segmented Through Hole Formation Using Dual Diameter Through Hole Edge Trimming", filed Aug. 19, 2013, which is hereby expressly incorporated by reference.

FIELD OF THE INVENTION

Various features relate to improvements to printed circuit boards (PCBs), and more particularly, to methods of segmented through hole formation using dual diameter through hole edge trimming within a PCB stackup to prevent copper plating from peeling off during the formation.

BACKGROUND

Consumers are increasingly demanding both faster and smaller electronic products. The use of PCBs has grown enormously as new electronic applications are marketed. A PCB is formed by laminating a plurality of conducting layers with one or more non-conducting layers. As the size of a PCB shrinks, the relative complexity of its electrical interconnections grows.

A plated via structure is traditionally used to allow signals to travel between layers of a PCB. The plated via structure is a plated hole within the PCB that acts as a medium for the transmission of an electrical signal. For example, an electrical signal may travel through a trace on one layer of the PCB, through the plated via structure's conductive material, and then into a second trace on a different layer of the PCB.

Unfortunately, due to limitations within the prior art, the plated via structure may be longer than necessary to perform the function of electrical connectivity. For example, the plated via structure may extend completely through the PCB but only connect two traces on two proximate adjacent layers. As a result, one or more stubs may be formed. A stub is excessive conductive material within the plated via structure which is not necessary to transport the electrical signal.

When a high speed signal is transmitted through the plated via structure, a "stub effect" may distort the signal. The stub effect is a result of the useless excess conductive material present within the plated via structure. The stub effect occurs when a portion of the signal is diverted away from the trace connections and into one or more stubs of the plated via structure. The portion of the signal may be reflected from the end of the stub back toward the trace connections after some delay. This delayed reflection may interfere with signal integrity and increase, for example, the bit error rate of the signal. The degenerating effect of the stub effect may increase with the length of the stub. As much as 50% of signal attenuation at signals running at 10 Gigabits per second may be due to the stub in the plated via structure. Via structures with short stubs can be manufactured but require sequential processing, which increases costs substantially.

FIG. 1 is an illustration of a PCB 100 with a plated via structure 110 and a stub 170 in the prior art. The PCB 100 comprises conducting layers 130 separated by nonconductive dielectric layers 120. Typically, the plated via structure 110 includes a barrel (i.e., shaft of the via structure) that is cylindrical in shape and is plated with a conductive material 180. The plated via structure 110 allows an electrical signal 160 to transmit from a trace 140 on a first conducting layer 130 of the PCB 100 to a trace 150 on a second conducting layer 130. The stub 170 of the plated via structure 110 is the unnecessary portion of the plated via structure 110, which may create the stub effect.

FIG. 2 is an illustration of the PCB 100 with the plated via structure 110 after the stub 170 (shown in FIG. 1) has been removed by a mechanical drill process called backdrilling in the prior art. Backdrilling the unnecessary portion of the plated via structure 110 to reduce or remove the stub 170 is one method to reduce the stub effect. Backdrilling is a viable alternative to sequential layer processing but has limitations. Typically, a drill bit which has a larger diameter than via structure 110 backdrills the stub 170 thereby removing a portion of the unnecessary excess conductive material of the plated via structure 110. A backdrilled hole 200 is created once the drill bit removes a portion of the stub 170 from the plated via structure 110. The drill bit is commonly a carbide drill bit in a computer numerically controlled (CNC) drill machine. As a result of backdrilling, the portion of the stub 170 of the plated via structure 110 is removed, thereby reducing, but not completely eliminating, parasitic capacitance, parasitic inductance, and time delay, which may interfere with signal integrity.

In most cases, design concessions need to be made to allow for deviations in the accuracy of the drilling equipment. If the backdrilling is inaccurate (e.g. too deep), then a functional portion of the plated via structure 110 may be removed and the PCB 100 may be ruined. If the backdrilling is too shallow or off center, then the stub effect will remain. As a consequence, a new PCB 100 must be reconstructed and backdrilled. Thus, yields are reduced and costs are increased.

The backdrilling process is also limited in the tolerances that can be reliably held. Backdrilling is typically only controllable to a depth tolerance of +/−5 mils. In many cases, further design concessions need to be made due to limitations in the strength and consistency of the layers to allow for variations in the placement, width, and direction of drilling.

Yet another limitation is that many designs require the backdrilling of multiple plated via structures 110 where the stubs 170 may be at different depths. This requires specialized programming of the drill tool files, which takes time and money to produce.

Further, backdrilling multiple plated via structures 110 typically is a serial process, so that the time needed to backdrill the PCB 100 increases with the number of stubs 170. If any one of the stubs 170 is drilled improperly, the PCB 100 may be ruined. Therefore, backdrilling a number of stubs 170 increases the probability of damage to the PCB 100.

Another limitation is that many designs also require stubs to be removed from both surfaces of the PCB 100. This requires that the PCB 100 be reoriented during the backdrilling process, which further takes time, requires additional programming, and adds potential error to the accuracy of the backdrilling process.

On the other hand, backdrilling would not change used space in the PCB compared with non-backdrilled plated through hole (PTH) structures. That is, the backdrill technique is not a solution PCB density enhancement which is demanded by the market.

The sequential lamination process is a solution for this market demand. It allows for the creation of buried via hole (BVH) and interstitial via hole (IVH) structures in the PCB which achieves a zero length stub. However, the sequential lamination process exponentially increases the cost of the PCB due to its long process and technical difficulties. Additionally, the sequential lamination process involves an increased risk of short and long term reliability degradation of the PCB.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a method for forming a segmented through hole in a printed circuit board using dual diameter through hole edge trimming is provided. The method includes drilling a first hole in the printed circuit board, the first hole having a first diameter; drilling a second hole within the first hole, the second hole having a second diameter where the second diameter is larger than the first diameter, and where a ledge is formed at a point between an end of the second hole and the first hole; applying an electroless copper to an inner surface of the first hole and the second hole; applying an electrolytic copper to the inner surface of the first hole and the second hole; and trimming material formed on the ledge when applying copper plating.

According to one aspect, the trimmed material is part of the electroless copper and the trimmed material includes at least part of a vertical wall of the first hole.

According to yet another aspect, the part of the electroless copper is trimmed using laser ablation; and wherein the laser ablation is a conformal mask method or a trepanning method.

According to yet another aspect, the part of the electroless copper is trimmed using a mechanical drill.

According to yet another aspect, the trimmed material is a catalyst for the electroless copper. The catalyst may be trimmed using laser ablation; and wherein laser ablation is a conformal mask method or a trepanning method. Alternatively, the catalyst for the electroless copper may be trimmed using a mechanical drill.

According to yet another aspect, the trimmed material is the electrolytic copper and is trimmed using laser ablation, a trepanning method or a mechanical drill. The laser ablation may use a laser drill having a diameter larger than a minimum diameter of the first hole and smaller than a surface drill diameter of an aperture size of the laser drill.

According to yet another aspect, a difference of the first hole diameter and the second hole diameter is greater than 25 microns.

According to another feature, a method for forming a segmented through hole in a printed circuit board using dual diameter through hole edge trimming is provided. The method includes drilling a first hole in the printed circuit board having a first diameter; drilling a pair of vertically aligned holes within opposite ends of the first hole forming a first ledge and a second ledge, the pair of vertically aligned holes having a second diameter where the second diameter is larger than the first diameter; applying an electroless copper to an inner surface of the first hole and the pair of vertically aligned holes; trimming material formed on the first and second ledges when applying copper plating; and applying an electrolytic copper to the inner surface of the first hole and the pair of vertically aligned holes.

According to one aspect, the trimmed material is the electroless copper and the trimmed material may include at least part of a vertical wall between the pair of vertically aligned holes. The part of the electroless copper may be trimmed using laser ablation or a mechanical drill.

According to yet another aspect, the trimmed material may be a catalyst for the electroless copper. The catalyst may be trimmed using laser ablation or a mechanical drill.

According to yet another aspect, the laser ablation is a conformal mask method or a trepanning method.

According to yet another aspect, the trimmed material is the electrolytic copper and wherein the part of the electrolytic copper is trimmed using laser ablation or a mechanical drill.

According to yet another aspect, the laser ablation uses a laser drill having a diameter larger than a minimum diameter of the first hole and smaller than a surface drill diameter of an aperture size of the laser drill.

According to yet another aspect, the laser ablation is a trepanning method.

According to yet another aspect, the copper plating is formed when the electroless copper and the electrolytic copper are applied.

BRIEF DESCRIPTION OF THE DRAWINGS

FIG. 7A illustrates an image of a three segmented through hole formed in a printed circuit board.

FIG. 7B illustrates a cross-sectional view of the through hole of FIG. 7A showing plating removed from upper and lower ledges using laser ablation.

FIG. 8A illustrates a three segmented through hole in which an intermediate section is electrically connected to a second through hole.

FIG. 12A illustrates an image of a three segmented through hole formed in a printed circuit board.

FIG. 12B illustrates a cross-sectional view of the through hole of FIG. 12A showing plating removed from upper and lower ledges to using a mechanical drill.

FIG. 13A illustrates the three segmented through hole of FIG. 12A, in which the intermediate section is electrically connected to a second through hole.

FIG. 16 (comprising FIGS. 16A-16D) illustrates a three drill step process for forming a two segmented through hole in a PCB, according to one example FIG. 17 (comprising FIGS. 17A-17D) illustrates cross-sectional views of the stages of the formation of the through hole in FIG. 16.

FIG. 18 (comprising FIGS. 18A-18D) illustrates a four drill step process for forming a three segmented through hole in a PCB, according to one example.

FIG. 19 (comprising FIGS. 19A-19D) illustrates cross-sectional views of the stages of the formation of the through hole in FIG. 18.

FIG. 25 (comprising FIGS. 25A-25F) illustrates an N drill step process for forming a through hole in a printed circuit board having (N+1)/2 segments, according to one example.

FIG. 26 (comprising FIGS. 26A-26F) illustrates cross-sectional views of the stages of the formation of the through hole in FIG. 25.

DETAILED DESCRIPTION OF THE INVENTION

Figure 1:
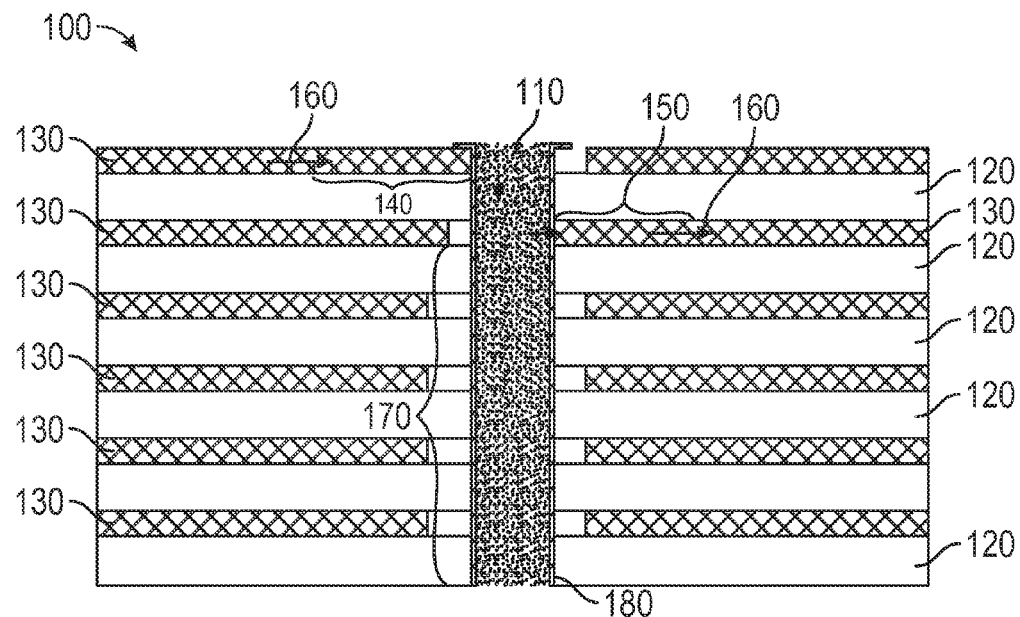
FIG. 1 is an illustration of a PCB with a plated via structure and a stub in the prior art.
Figure 2:
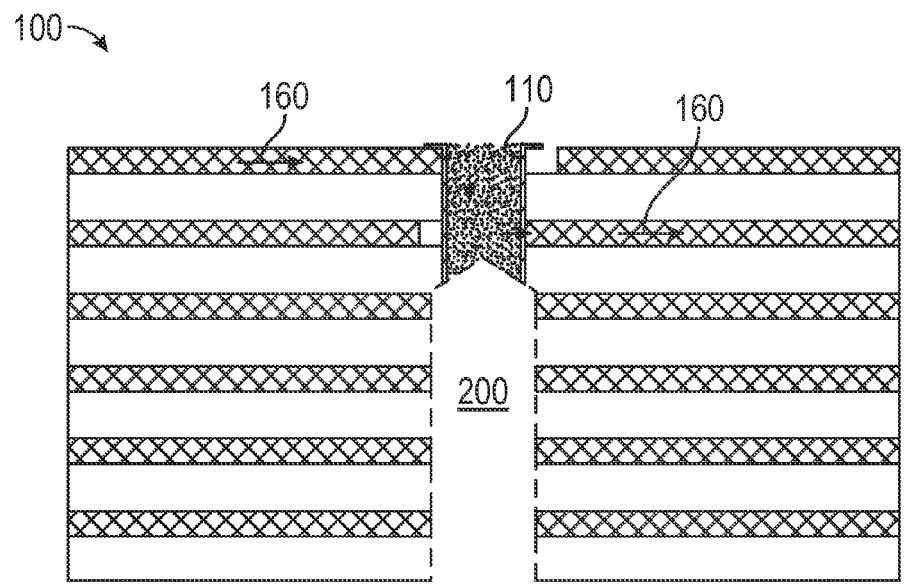
FIG. 2 is an illustration of the PCB with the plated via structure after the stub has been removed by backdrilling in the prior art.

In the following detailed description, numerous specific details are set forth in order to provide a thorough understanding of the embodiments. However, it will be understood by one of ordinary skill in the art that the embodiments may be practiced without these specific details. For example, operations may be shown in block diagrams, or not be shown at all, in order not to obscure the embodiments in unnecessary detail. In other instances, well-known operations, structures and techniques may not be shown in detail in order not to obscure the embodiments.

Overview

The present disclosure provides a cost effective and efficient system to maximize printed circuit board (PCB) utilization (density) with minimized signal degradation. This system avoids a costly sequential lamination process by electrically isolating the segmented via structure by controlling the formation of a conductive material within a plated via structure of the PCB. In one aspect, the present disclosure uses different diameter drills within a via structure for trimming the conductive material at the via shoulder (i.e., the rim of a drilled two diameter hole boundary). The trimmed portion may be voided in the via structure for allowing electrically isolated plated through-hole (PTH) segments. One or more areas of trimmed rims within the via structure are used to form multiple stair like diameter holes to create one or more voids in the via structure. As a result, the formation of conductive material within the via structure may be limited to those areas necessary for the transmission of electrical signals. According to certain embodiments, the partitioning of the via structure into electrically isolated segments can dramatically increase the route capabilities or wiring density of a PCB design. This is because each electrically isolated segment of the partitioned via can be used to electrically connect signals on layers associated with that particular segment.

A multilayer PCB can be a chip substrate, a motherboard, a backplane, a backpanel, a centerplane, a flex or rigid flex circuit. The present disclosure is not restricted to use in PCBs. A via structure can be a PTH used for transmitting electrical signals from one conducting layer to another. A plated via structure can also be a component mounting hole for electrically connecting an electrical component to other electrical components on the PCB.

The methods to electrically isolate segmented via structures of PCBs may be faster and more efficient than the conventional sequential lamination process. Using the sequential lamination process to form a two segmented discontinuous through hole or via structure would require three cycles of lamination. On the other hand, the process of the present disclosure in one aspect uses a single lamination cycle and a two drill step process. To form a three segmented via using the convention sequential lamination process would require four cycles of lamination while the process of the present disclosure uses a single lamination followed by a three drill step process.

It would be advantageous to partition each of the vias and control the stub to variable degrees for each via. In other words, each via can be partitioned at different layers and at different locations. To be able to obtain a multi-level partitioned via on a single panel, a rim position of two drills (two drill step process) having different diameters may be controlled at a selected layer by the via. For example, the first drill step may be the PTH formation that is used for all vias. The second drill step may utilize controlled depth drilling, based on the PCB design that targets the void position. Next, the vias may be plated with a conductive material, such as copper plating. The shoulders in the PTHs may be trimmed using a laser or mechanical drill process. Thus, one lamination cycle can achieve two electrical segments of via structure formation. In another example, the trimming of conductive material at the PTH shoulder may occur after catalyst deposition during the electroless copper plating. Alternatively, the trimming of conductive material may occur after the electroless copper deposition process. This alternative process may provide an advantage for laser drill trimming as it requires lower laser emission energy to remove unnecessary conductive material and it reduces risk of via damage by the laser process. In contrast, as discussed previously, the sequential lamination process is generally performed upon one via structure at a sequential process cycle and a final assembly process. Thus, methods incorporating multiple diameter drill holes in a PTH with trimming process to shorten total PCB formation process limiting stub formation may allow for faster production of PCBs than the sequential lamination process.

Typical Formation of a Two Segmented Through Hole Using a Mechanical Through Approach Referring to FIGS. 3A-D, the different fabrication stages for forming a two segmented discontinuous through hole (or via) 300 (FIG. 3D) are illustrated. The through hole 300 has an upper conductive portion 302, a lower conductive portion 304, and an intermediate non-conductive, electrically insulating portion 312. Although not shown, the through hole (or via) is formed in a multilayer PCB stackup that may include one or more core and/or sub-composite structures that are laminated together to form the PCB stackup. Each core and/or sub-composite structure may include one or more dielectric layers and/or one or more conductive layers that form a rigid, rigid-flex structure, and/or flexible structure.

As described below, a four (4) drill step process may be used to form the two (2) segmented through hole. In the first step, a pair of vertically aligned holes 302 and 304, upper and lower of a diameter d1 and d2, respectively (See FIG. 4A), is drilled from the upper surface and lower surface, respectively, of the PCB (not shown). The upper hole 302 and the lower hole 304 may be separated by an interior section 306 of the board (not shown). The interior section 306 may be positioned to be at the layers of the PCB where a discontinuity in the discontinuous through hole is desired.

Next, an intermediate hole 308 of a diameter d3 (See FIG. 4B) is then drilled though the interior section 306. (FIG. 3B) As shown in FIGS. 4A and 4B, diameters d1 and d2 may be larger than diameter d3. The interior surface of the holes 302, 304 and 308 may then plated with a seed conductive material and a further coating of conductive material, for example. (FIG. 3C)

Figures 3A, 3B, 3C, 3D:
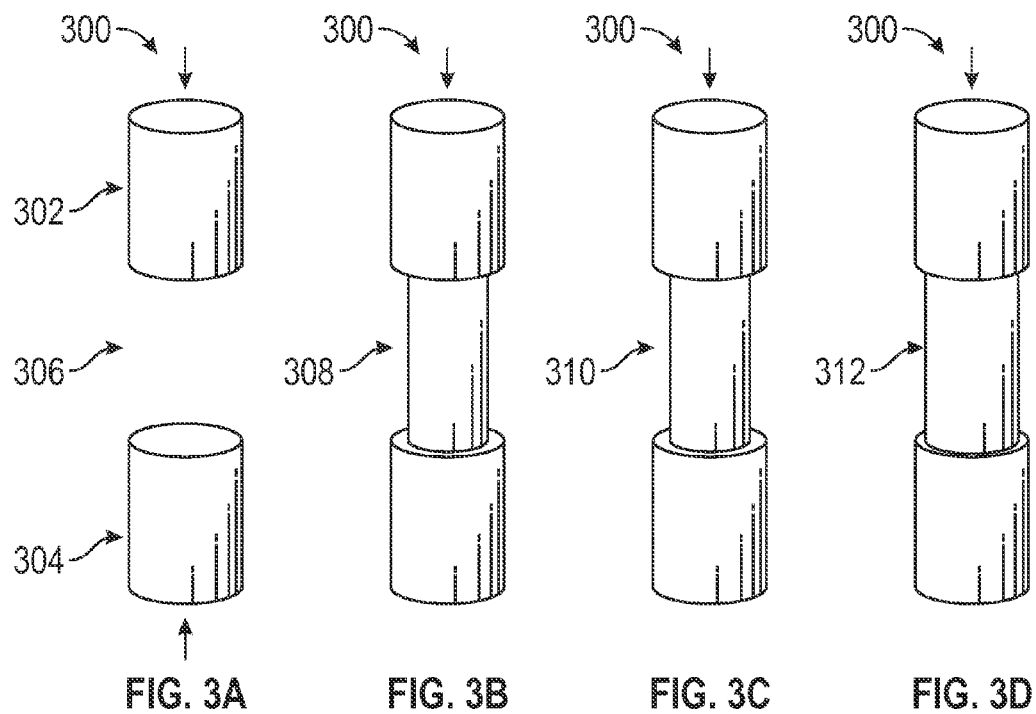
FIG. 3 (comprising FIGS. 3A-3D) is an illustration of the different fabrication stages for forming a two segmented discontinuous through hole (or via).
Figures 4A, 4B, 4C, 4D:
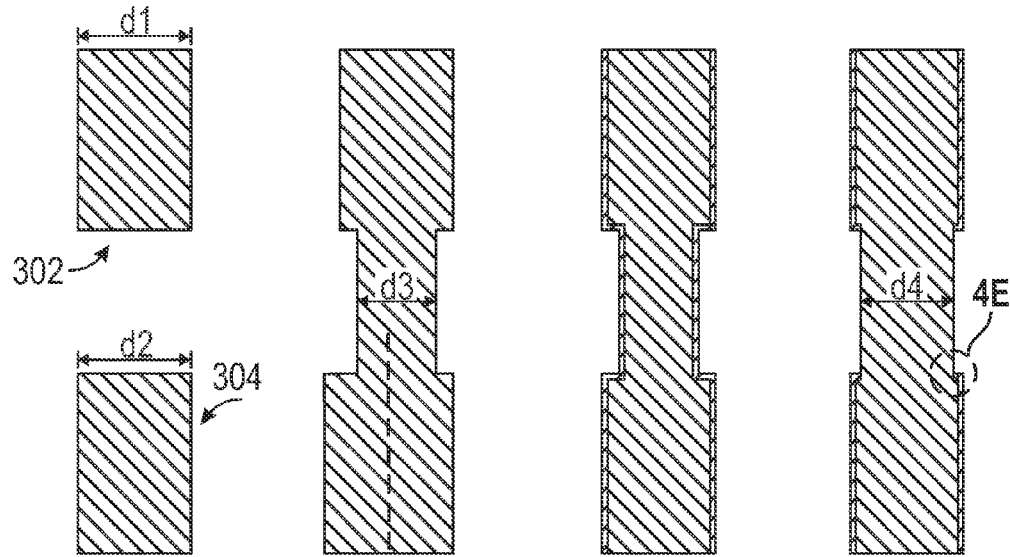
FIG. 4 (comprising FIGS. 4A-E) illustrates cross-sectional views of the stages of the formation of the discontinuous through hole in FIG. 3.

Referring to FIG. 3D, after the holes 302, 304 and 308 are plated, the plated through hole (or via) 300 may be drilled with a drill bit having a diameter d4 (See FIG. 4D) which may be larger than diameter d3 and smaller than diameters d1 and d2 in order to remove the plating on the walls of the intermediate hole 308 of the through hole, but leave intact the plating on the upper and lower through hole portions 302, 304, respectively, as shown.

Cross-sectional views of the stages of the formation of the discontinuous through hole 300 of FIGS. 3A-D are illustrated in FIGS. 4A-D. As shown in FIG. 4A, the second drill used to form the lower conductive portion 304 of the hole may have an unexpected offset (See FIG. 4B) resulting in the lower conductive portion 304 being offset from the upper conductive portion 302. As a result of this offset, when the drill bit, having a diameter d3, is drilled it may limit the drill step process due to reduced drill tolerance.

Figure 4E:
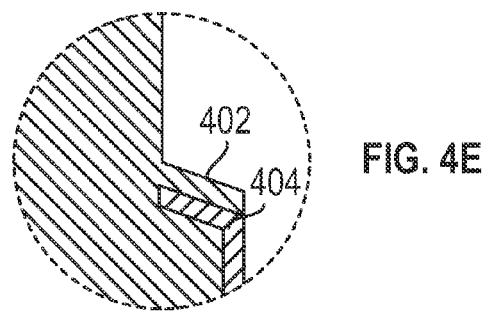

Next, the interior surface of the holes 302, 304 and 308 are plated 310 with a seed conductive material and a further coating of conductive material, for example. FIG. 4C illustrates a cross-sectional view of the inner surface of the through hole 300 plated. After plating, the through hole is drilled with a drill bit having a diameter d4 which is larger than the diameter d3 and smaller than the diameters d1 and d2. By drilling with the drill bit having a diameter d4, the plating on the walls of the intermediate hole 308 of the through hole may be removed while leaving intact the plating on the upper and lower via portions 302, 304, respectively, as shown. (See FIG. 4D) However, as a result of the mechanical stress caused by the $4^{th}$ drilling, there is a potential of copper lift off on a ledge or shoulder of the through hole 300. FIG. 4E illustrates an example of mechanical stress causing copper to be lifted off a ledge or shoulder of a through hole. For ease of understanding, the ledge 402 and plating (copper lift off) 404 of FIG. 4E is shown as angled as opposed to horizontal lines in FIGS. 4A-4D. Ledges or shoulders are formed within the hole at locations where diameters within the hole change. The copper lift off can be problematic as the ledge, or shoulder, is close to the trace area on the PCB and there is a potential for an opening. Furthermore, the short and long term reliability is a concern.

Typical Through Holes (or Via Structures)—Laser Ablation

One method of drilling holes in a printed circuit board is to use a laser of suitable power and wavelength. This process is generally referred to as laser ablation. For example, an ultraviolet laser, such as the third harmonic of yttrium aluminum garnet (YAG) laser, and Carbon Dioxide ($CO_2$) laser are suitable for ablating holes through resin-based circuit board substrates. Metal layers on the surface of the board can be used as masks when a $CO_2$ laser is used to define the required pattern of holes (conformal mask method). The diameter of the laser drill may be selected by the method used. When laser machine aperture size is larger than the minimum mechanical drill diameter of the hole formation used, the whole hole area may be shot by laser. There may be multiple laser shots in the laser drill process. When the laser drill process selected is the trepanning method, the laser drill diameter selected may be large enough to trim ledge/shoulder area in the hole. The $CO_2$ laser may use the conformal mask method and UV-YAG laser may use the trepanning method.

Figure 5A:
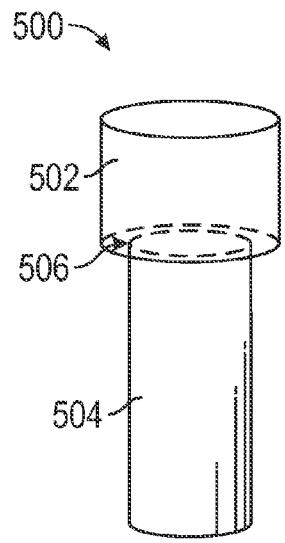
FIG. 5A illustrates an image of a two segmented through hole formed in a printed circuit board.
Figure 5B:
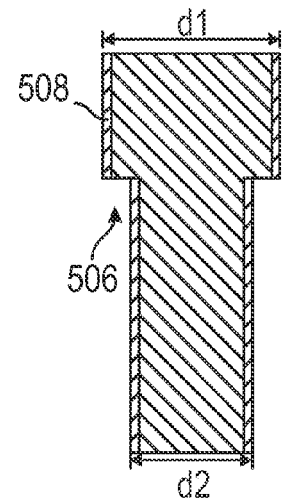
FIG. 5B illustrates a cross-sectional view of the through hole of FIG. 5A showing plating removed from a ledge in the through hole using laser ablation.

FIG. 5A illustrates an image of a two segmented through hole 500 formed in a printed circuit board (not shown). FIG. 5B illustrates a cross-sectional view of the through hole of FIG. 5A showing plating removed from a ledge within the through hole using laser ablation. Although not shown, the through hole may be formed in a multilayer PCB stackup that may include one or more core and/or sub-composite structures that are laminated together to form the PCB stackup. Each core and/or sub-composite structure may include one or more dielectric layers and/or one or more conductive layers that form a rigid, rigid-flex structure, and/or flexible structure.

The through hole 500 is formed by drilling a first hole (or hole portion) 502 using a drill bit having a diameter d1 and then drilling a second hole (or hole portion) 504 using a drill bit having a diameter d2, where the diameter d2 is smaller than diameter d1. (See FIG. 5B) When the second hole (or hole portion) 504 is drilled, ledges or shoulders 506 are formed within the through hole 500 at locations or transitions of holes having different diameters. Once the two holes have been drilled, plating 508, such as copper, is applied to the internal surface of the two segmented through hole 500. Excess plating accumulates on the ledge 502 within the through hole and laser ablation is used to trim the excess plating from the ledge 506 to form the two segmented via structure in a hole. According to one example, when trimming the ledges, part of the copper plating on the vertical wall of the second hole may be trimmed as well. For example, the part of the copper plating trimmed on the vertical wall of the second hole may be quarter the length of the wall or less than a quarter the length of the wall. According to another example, the part of the copper plating trimmed on the wall of the second hole may be equal to half the length of the wall or less than half the length of the wall.

The drill process sequence and direction is not the main contributor for a successful result. The second hole (or hole portion) 504 may be the first drill and the first hole (or hole portion) 502 may be fabricated thereafter. Also when second hole (or hole portion) 504 is fabricated after the fabrication of the first hole (or hole portion) 502, drilling proceeds from the first hole (or hole portion) 502 side.

Figure 6A:
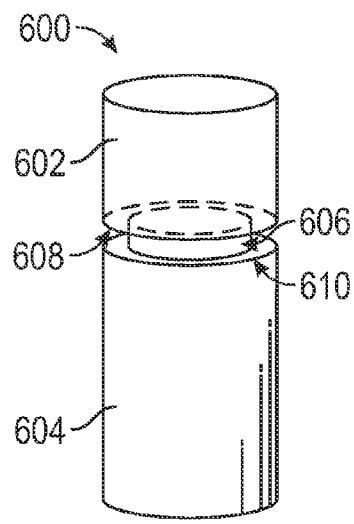
FIG. 6A illustrates an image of a three segmented through hole formed in a printed circuit board.
Figure 6B:
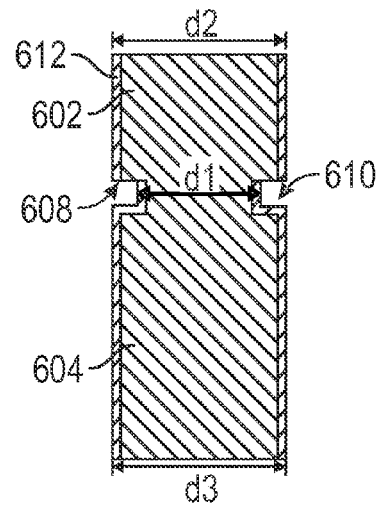
FIG. 6B illustrates a cross-sectional view of the through hole of FIG. 6A showing plating removed from an upper ledge in the through hole using laser ablation.

FIG. 6A illustrates an image of a three segmented hole 600 formed in a PCB (not shown). FIG. 6B illustrates a cross-sectional view of the hole of FIG. 6A showing plating removed from an upper ledge using laser ablation.

Although not shown, the through hole may be formed in a multilayer PCB stackup that may include one or more core and/or sub-composite structures that are laminated together to form the PCB stackup. Each core and/or sub-composite structure may include one or more dielectric layers and/or one or more conductive layers that form a rigid, rigid-flex structure, and/or flexible structure.

To form the three segmented hole 600, a pair of vertically aligned holes 602 and 604, upper and lower, respectively, of relatively large diameter d2 and d3 (See FIG. 6B), respectively, is drilled from the upper surface and lower surface of the PCB (not shown). The drill diameters d2 and d3 may be same. The upper hole 602 and the lower hole 604 are separated by an interior section 606 of the board (not shown). Using a drill bit having a diameter d1, where d1 is smaller than d2 and d3, an interior hole is drilled and a first ledge 608 and a second ledge 610 are formed within the through hole 600. Plating 612, such as copper, is applied to the internal surface of the three segmented hole 600. Excess plating accumulates on the first ledge 608 and the second ledge 610. Although the plating is shown trimmed using laser ablation from the first ledge 608 as an example of a two segmented via structure, the plating on the second ledge 610 may also be trimmed to form a three segmented via structure in a hole.

According to one aspect, when trimming the ledges, part of the copper plating on at least part of the wall between the pair of vertically aligned holes 602 and 604 may be trimmed. For example, the part of the copper plating trimmed on the wall between the pair of vertically aligned holes 602 and 604 may be quarter the length of wall or less than a quarter the length of the vertical wall. According to another example, the part of the copper plating trimmed on the wall between the pair of vertically aligned holes 602 and 604 may be equal to half the length of the wall or less than half the length of the wall.

Multiple procedures may be used for fabricating a three segmented via hole. For example, in a first procedure the upper hole 602 and the lower hole 604 may be fabricated prior to the fabrication of the interior section 606. The interior section 606 may be drilled from the upper hole 602 side or the lower hole 604 side. In a second procedure, the interior section 606 is fabricated as a through hole with a diameter d1 and then the upper hole 602 and the lower hole 604 are drilled.

FIG. 7A illustrates a three segmented through hole 700 formed in a printed circuit board (not shown). FIG. 7B illustrates a cross-sectional view of the through hole of FIG. 7A showing plating removed from upper and lower ledges using laser ablation. As shown, the three segmented hole 700 is comprised of an upper conductive portion 702, a lower conductive portion 704, and an intermediate non-conductive, electrically insulating portion 706. Although not shown, the through hole may be formed in a multilayer PCB stackup that may include one or more core and/or sub-composite structures that are laminated together to form the PCB stackup. Each core and/or sub-composite structure may include one or more dielectric layers and/or one or more conductive layers that form a rigid, semi-rigid, semi-flexible, and/or flexible structure.

The three segmented hole 700 is formed by a pair of vertically aligned holes 702 and 704, upper and lower, respectively, of a relatively large diameter d2 and d3 (See FIG. 7B), respectively, that is drilled from the upper surface and lower surface of the PCB (not shown). The upper hole 702 and the lower hole 704 are separated by an intermediate hole 706 drilled using a drill bit of a relatively small diameter d1 (See FIG. 7B). Using a mechanical drill, the intermediate hole 706, a first ledge 708, and a second ledge 710 are formed within the hole 700.

Next, a seeding conductive material, such as electroless copper plating, is applied to the hole 700. The deposited catalyst, or the electroless copper plating, on the first ledge 708 and/or the second ledge 710 is trimmed by a laser. Electrolytic plating is then be applied to the hole 700 and the interior surfaces of the holes 702 and 704 are formed with electrolytic copper 712, however, the electroless plating catalyst, or copper, on the inner surface of intermediate hole 706 is not plated over so as to electrically isolate it from the surface. The electroless copper is then be solved by acidic electrolytic copper plating solution. As a result, only the upper and lower holes 702, 704 are plated with copper.

Figure 8B:
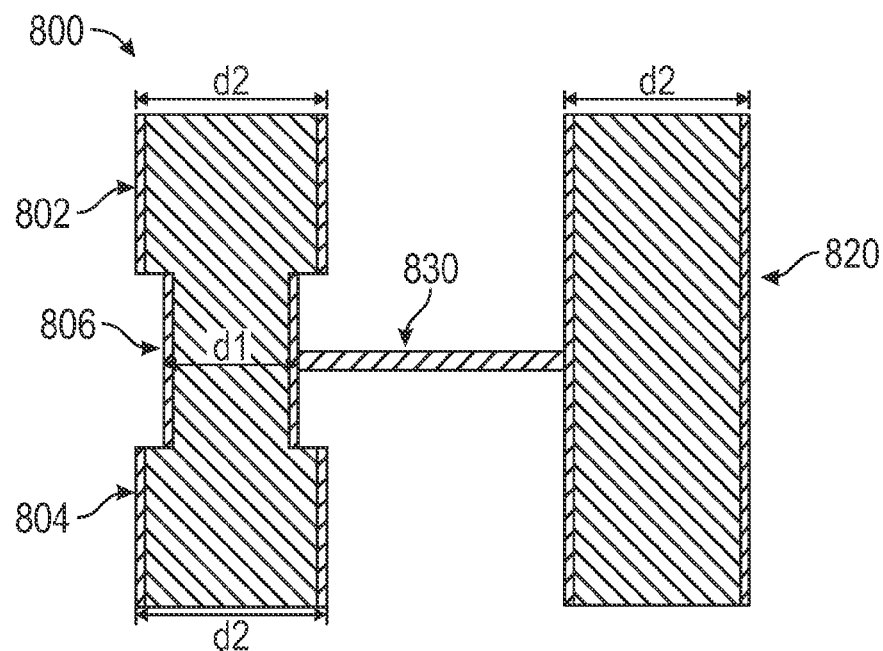
FIG. 8B is a cross-sectional view of the three segmented through hole connected to the second through hole in FIG. 8B.

FIG. 8A illustrates a three segmented hole 800, in which an intermediate section 806 is electrically connected to a second through hole 820 through a conductive trace 830. FIG. 8B is a cross-sectional view of the three segmented hole 800 connected to the second through hole 820 of FIG. 8A. The conductive trace 808 allows the three segmented hole 800 to be electrically connected to the second through hole 820 forming the structure in FIG. 8A even though the ledge/shoulder 808 and/or 810 are trimmed during the electroless plating phase.

Typical Through Holes (or Via Structures)—Mechanical Drill

Another method of forming a segmented via structure in a printed circuit board uses a mechanical drill to trim excessive seeding of plating or conductive material from the ledge/shoulder area.

Figure 9A:
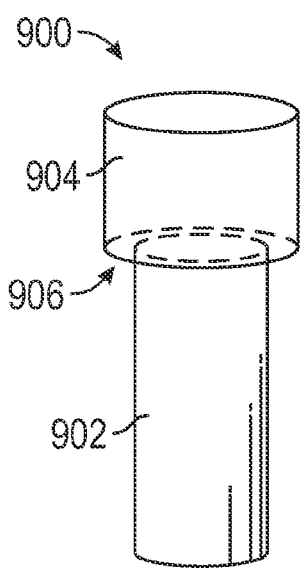
FIG. 9A illustrates an image of a two segmented through hole formed in a printed circuit board using mechanical drills.
Figure 9B:
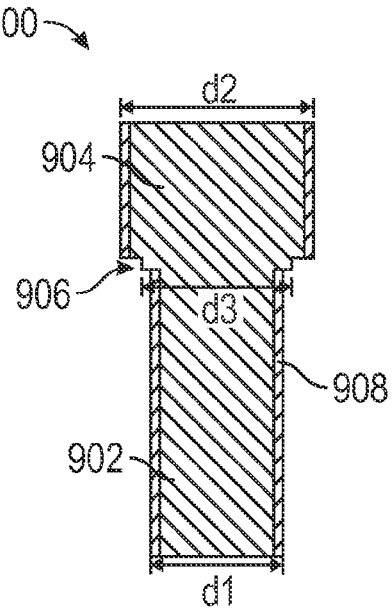
FIG. 9B illustrates a cross-sectional view of the through hole of FIG. 9A showing plating removed from a ledge using a mechanical drill.

FIG. 9A illustrates a two segmented through hole 900 formed in a printed circuit board (not shown) using mechanical drills. FIG. 9B illustrates a cross-sectional view of the through hole of FIG. 9A showing plating removed from a ledge 906 using a mechanical drill. As illustrated by the cross-sectional view of the through hole 900, three (3) different sizes of mechanical drills are used to form the hole 900.

The through hole 900 is formed by drilling a first hole 902 using a the drill bit having a diameter d1 and then drilling a second hole 904 using a drill bit having a diameter d2, where the diameter d2 is larger than diameter d1. Ledges or shoulders 906 are formed within the through hole 900 at locations where diameters within the hole change. Once the two holes 902, 904 have been drilled, plating 908, such as copper, is applied to the internal surface of the two segmented hole 900. Excess plating accumulates on the ledge 906 and a mechanical drill is used to trim the excess plating from the ledge 906. As the mechanical drill needs to have a diameter larger than d1 but smaller than d2, a third drill bit having a diameter d3 is needed to trim the excess plating from the ledge.

According to one example, when trimming the ledges, part of the copper plating on the vertical wall of the first hole 902 may be trimmed as well. For example, the part of the copper plating trimmed on the vertical wall of the first hole 902 may be quarter the length of the wall or less than a quarter the length of the wall. According to another example, the part of the copper plating trimmed on the wall of the first hole 902 may be equal to half the length of the wall or less than half the length of the wall.

Figure 10A:
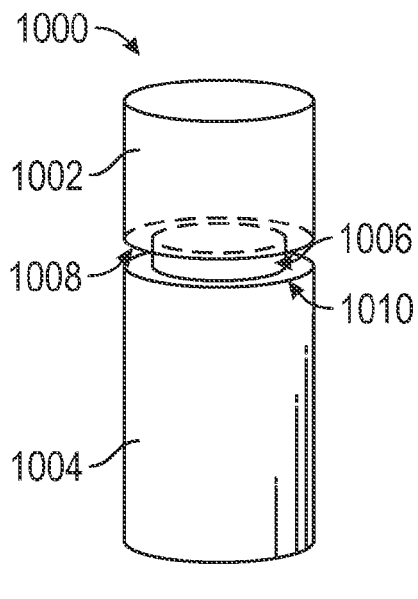
FIG. 10A illustrates an image of a three segmented hole formed in a printed circuit board.
Figure 10B:
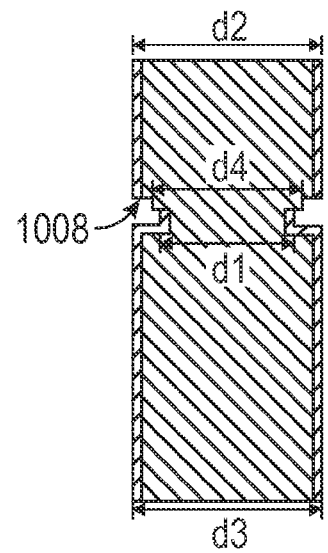
FIG. 10B illustrates a cross-sectional view of the hole of FIG. 10A showing plating removed from an upper ledge to using a mechanical drill.

FIG. 10A illustrates a three segmented hole 1000 formed in a PCB (not shown). FIG. 10B illustrates a cross-sectional view of the hole of FIG. 10A showing plating removed from an upper ledge using a mechanical drill. To form the three segmented hole 1000, a pair of vertically aligned holes 1002 and 1004, upper and lower, of relatively large diameter d2 and d3, respectively (See FIG. 10B), are drilled from the upper surface and lower surface of the PCB (not shown). The diameters d2 and d3 may be the same. The upper hole 1002 and the lower hole 1004 may be separated by an interior section 1006 of the board (not shown). Using a drill bit having a diameter d1, where d1 is smaller than d2 and d3, an interior hole is drilled and a first ledge 1008 and a second ledge 1010 is formed within the hole 1000. Next, a seeding conductive material, such as electroless copper plating, is applied to the internal surface of the three segmented hole 1000. Excess plating seed accumulates on the first ledge 1008 and the second ledge 1010 during the electroless metallization process and a mechanical drill having a diameter d4 is used to trim the excess plating from the ledge 1008. As the mechanical drill needs to have a diameter larger than d1 but smaller than d2, a third drill bit having a diameter d4 is needed to trim the excess plating from the ledge.

According to one aspect, when trimming the ledges, part of the copper plating on at least part of the wall between the pair of vertically aligned holes 1002 and 1004 may be trimmed. For example, the part of the copper plating trimmed on the wall between the pair of vertically aligned holes 1002 and 1004 may be quarter the length of wall or less than a quarter the length of the vertical wall. According to another example, the part of the copper plating trimmed on the wall between the pair of vertically aligned holes 1002 and 1004 may be equal to half the length of the wall or less than half the length of the wall.

Figure 11A:
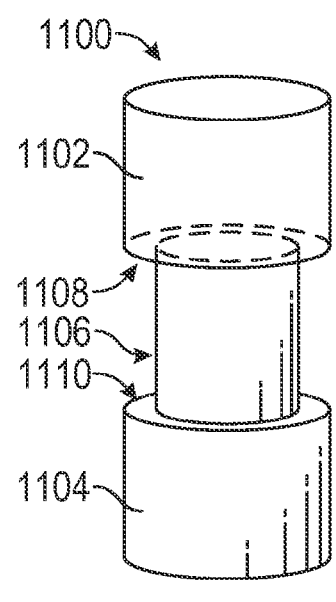
FIG. 11A illustrates an image of a three segmented through hole formed in a printed circuit board.
Figure 11B:
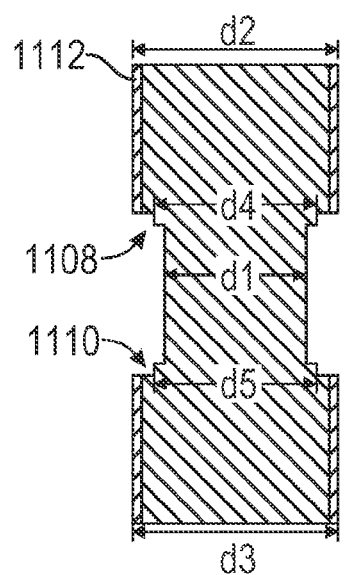
FIG. 11B illustrates a cross-sectional view of the through hole of FIG. 11A using a mechanical drill to trim excess plating.

FIG. 11A illustrates a three segmented hole 1100 formed in a PCB (not shown). FIG. 11B illustrates a cross-sectional view of the hole of FIG. 11A. As illustrated by the cross-sectional view of the hole 1100, five (5) different sizes of mechanical drills are used to form the hole 1100. The diameters d2 and d3, d4 and d5 may be the same size.

As shown, the three segmented through hole 1100 is comprised of an upper conductive portion 1102, a lower conductive portion 1104, and an intermediate non-conductive, electrically insulating portion 1106. Although not shown, the through hole may be formed in a multilayer PCB stackup that may include one or more core and/or sub-composite structures that are laminated together to form the PCB stackup. Each core and/or sub-composite structure may include one or more dielectric layers and/or one or more conductive layers that form a rigid, semi-rigid, semi-flexible, and/or flexible structure.

The three segmented hole 1100 is formed using a mechanical drill to drill a pair of vertically aligned holes 1102 and 1104, upper and lower, respectively. The mechanical drill, having a relatively large diameter d2 and d3 (where d2 is equal to d3), respectively (See FIG. 11B), is drilled from the upper surface and lower surface of the PCB (not shown). The upper hole 1102 and the lower hole 1104 are separated by an intermediate hole 1106 drilled using a drill bit of a diameter d1 (See FIG. 11B), where d1 is less than d2 and d3.

Using a mechanical drill, the intermediate hole 1106, a first ledge 1108 and a second ledge 1110 are formed within the hole 1100. Plating 1112, such as copper, is applied to the internal surface of the upper and lower holes 1102, 1104. Next, a seeding conductive material, such as electroless copper plating, is applied to the internal surface of the upper and lower holes 1102, 1104. Excess plating seed accumulates on the first ledge 1108 and the second ledge 1110 during the electroless metallization process and mechanical drills, having diameters d3 and d4, are used to trim the excess plating seed from the ledges 1108, 1110. As the mechanical drill needs to have a diameter larger than d1 but smaller than d2 and d3, fourth and fifth drill bits having a diameters d4 and d5, respectively, are needed to trim the excess plating seed from the ledges so that the intermediate portion 1106 is electrically isolated from the surface of the PCB. As the result of trimming the excess plating seed from the ledges, the ledges will not be plated over by conductive material.

According to one aspect, at least part of the wall of the intermediate hole 1106 between the pair of vertically aligned holes 1102 and 1104 may be trimmed when trimming the ledges. For example, the trimmed part of the wall of the intermediate hole 1106 may be equal to half the length of the wall or less than half the length of the wall. According to another example, the trimmed part of the wall of the intermediate hole 1106 may be quarter the length of the wall or less than a quarter the length of the wall.

FIG. 12A illustrates a three segmented hole 1200 formed in a PCB (not shown). FIG. 12B illustrates a cross-sectional view of the hole of FIG. 12A. As illustrated by the cross-sectional view of the through hole 1200, five (5) different sizes of mechanical drills are used to form the through hole 1200.

As shown, the three segmented through hole 1200 may be comprised of an upper conductive portion 1202, a lower conductive portion 1204, and an intermediate portion 1206. Although not shown, the through hole is formed in a multilayer PCB stackup that may include one or more core and/or sub-composite structures that are laminated together to form the PCB stackup. Each core and/or sub-composite structure may include one or more dielectric layers and/or one or more conductive layers that form a rigid, semi-rigid, semi-flexible, and/or flexible structure.

The three segmented through hole 1200 is formed by drilling a pair of vertically aligned holes 1202 and 1204, upper and lower, respectively, using a mechanical drill. The mechanical drill may have a relatively large diameter d2 and d3 (See FIG. 12B) and may be drilled from the upper surface and lower surface of the PCB (not shown). The drill diameters d2 and d3 may be the same size. The upper hole 1202 and the lower hole 1204 are separated by an intermediate hole 1206 drilled using a drill bit of a relatively small diameter d1 (See FIG. 12B).

Using a mechanical drill, the intermediate hole 1206 a first ledge 1208 and a second ledge 1210 are formed within the hole 1200. Plating 1212, such as copper, is applied to the internal surface of the upper and lower holes 1202, 1204 as well as the intermediate hole 1206. Excess plating accumulates on the first ledge 1208 and the second ledge 1210 and a mechanical drill having a diameter d4 and d5 (d4 is equal to d5) is used to trim the excess plating from the ledges 1208, 1210. As the mechanical drill needs to have a diameter larger than d1 but smaller than d2 and d3, fourth and fifth drill bits having diameters d4 and d5 are needed to trim the excess plating from the ledges. The drill diameter d4 and d5 may be same.

According to one aspect, when trimming the ledges, part of the copper plating on at least part of the wall between the pair of vertically aligned holes 1202 and 1204 may be trimmed. For example, the part of the copper plating trimmed on the wall between the pair of vertically aligned holes 1202 and 1204 may be quarter the length of wall or less than a quarter the length of the vertical wall. According to another example, the part of the copper plating trimmed on the wall between the pair of vertically aligned holes 1202 and 1204 may be equal to half the length of the wall or less than half the length of the wall.

Figure 13B:
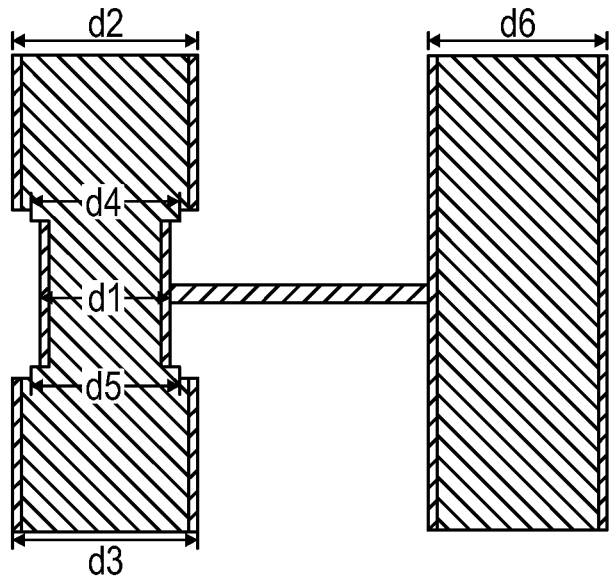
FIG. 13B is a cross-sectional view of the three segmented through hole connected to the second through hole in FIG. 13A.

FIG. 13A illustrates the three segmented through hole 1200 of FIG. 13A, in which the intermediate section is electrically connected to a second through hole 1300. FIG. 13B is a cross-sectional view of the three segmented through hole 1200 connected to the second through hole 1300 in FIG. 13A.

Dual Diameter Through Hole Edge Trimming

Figure 14:
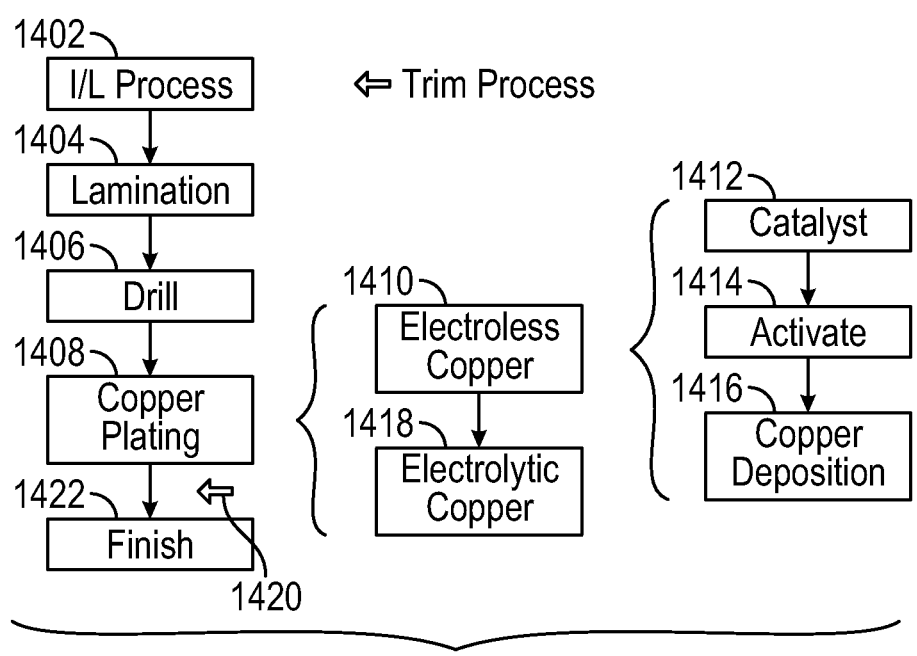
FIG. 14 illustrates a method for forming a printed circuit board (PCB) having one or more through holes.

FIG. 14 illustrates a method for forming a printed circuit board (PCB) having one or more through holes, such as the through holes as described above with reference to FIGS. 3, 4, 5, 6, 8, 9, 10, 12 and/or 13. In this method, excess plating material may be trimmed after the electrolytic copper has been formed in the inner surface of the through hole. As is known in the art, manufacturing a printed circuit board may include the process of forming a first core or sub-composite structure 1402 which may then be laminated to one or more dielectric layers and/or other core or sub-composite structures 1404. One or more through holes may be formed through core or sub-composite structure 1404, the one or more dielectric layers and the other core or sub-composite structures by drilling 1406, as described above. An interior surface of the through hole may be plated with a conductive material, such as copper, to form a plated through hole (PTH) 1408.

To plate the interior surface of the through hole with copper, an electroless copper may be applied to the interior surface of the through hole 1410. Applying the electroless copper may include placing the PCB in a seed or catalyzing bath 1412 causing the seed to deposit on the internal surface of the through hole and activating 1414 the catalyst causing copper to be deposited on the interior surface of through hole 1416.

After the electroless copper is applied 1410, the PCB may then be placed into an electrolytic copper plating bath 1418 and copper will plate where there is seed or conductivity. After the electrolytic copper is applied 1418, excess copper may be trimmed from the ledges/shoulders in the through holes 1420 and the process is finished 1422. Trimming of the ledges/shoulders may include copper wall trimming continuing from the ledges/shoulders.

Figure 15:
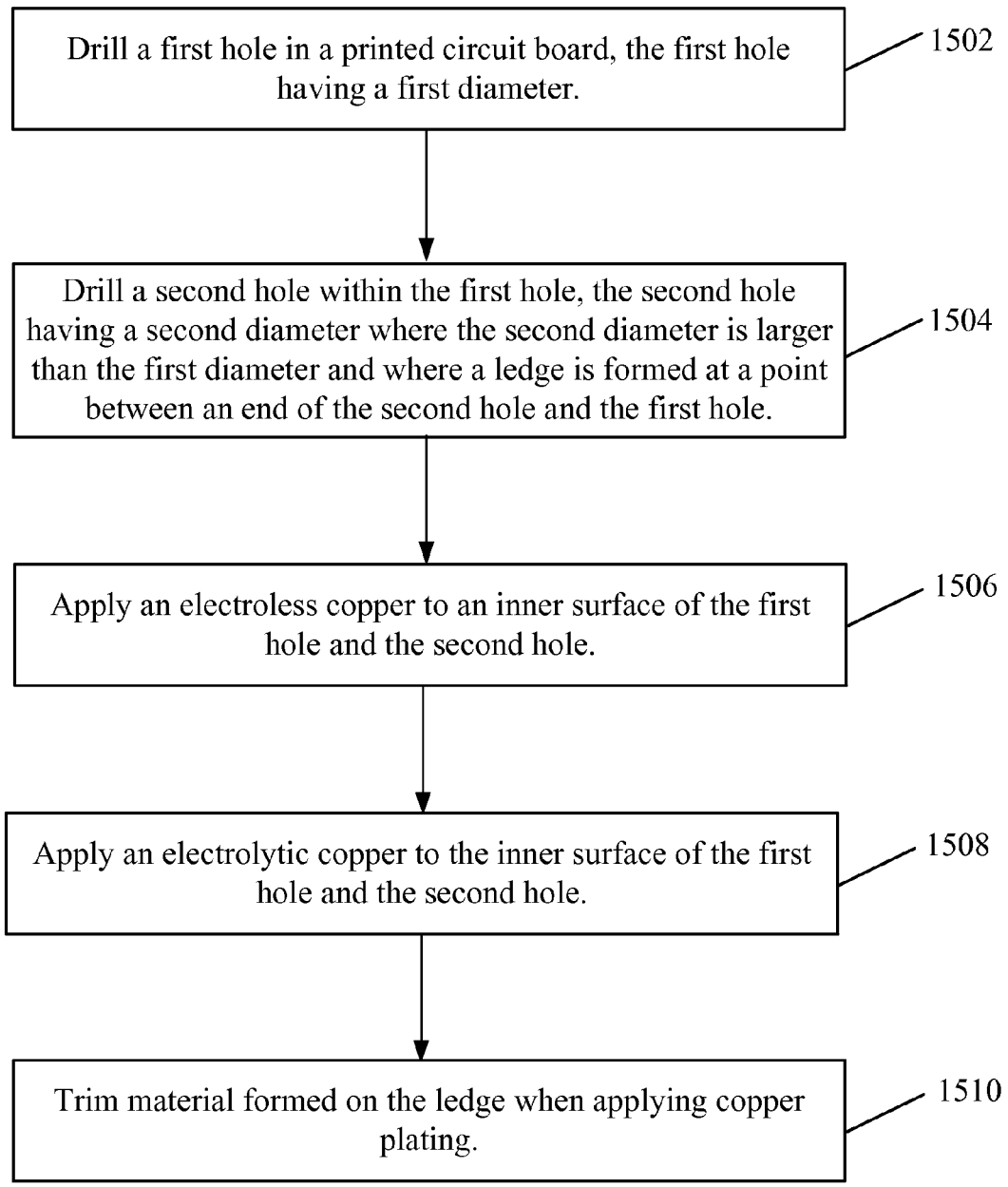
FIG. 15 illustrates a method for making a segmented through hole in printed circuit board using dual diameter through hole edge trimming.

FIG. 15 illustrates a method for making a segmented through hole in printed circuit board using dual diameter through hole edge trimming. In the method, a first hole, having a first diameter, may be drilled in a printed circuit board 1502. Next, a second hole, having a second diameter, may be drilled within the first hole forming a ledge at a point between an end of the second hole and the first hole 1504. According to one example, the second diameter may be larger than the first diameter by more than 25 microns. An electroless copper may then applied to the inner surface of the first hole and the second hole 1506. Next, an electrolytic copper may be applied to the inner surface of the first hole and the second hole 1508. Material formed on the ledge when applying the copper plating may then be trimmed 1510. Trimming of the ledge includes trimming of the copper plating continuing from the ledge. The plated copper may be trimmed using laser ablation or using a mechanical drill, for example. Once the ledge has been trimmed, the hole is prepared as an electrically isolated segmented plated through hole.

Formation of Through Holes (or Via Structures)—Drill prior to Electrolytic Plating FIG. 16 (comprising FIGS. 16A-16D) illustrates a three drill step process for forming a two segmented through hole in a PCB, according to one example. FIG. 17 (comprising FIGS. 17A-17D) illustrates cross-sectional views of the stages of the formation of the through hole in FIG. 16.

In this example, a first vertical hole 1602, having a diameter d1, may be drilled (FIGS. 16A, 17A) through the layers in a PCB (not shown). Next, a second vertical hole 1604, having a diameter d2, may be drilled (FIG. 16B, 17B) through the first vertical hole 1602. According to one aspect, diameter d2 may be larger than diameter d1. The interior surface of the holes may then be plated 1606 (FIG. 16C, 17C) with a seed conductive material, such as electroless copper plating. Excess plating seed, which accumulates on the ledge or shoulder 1608 of the through hole during the electroless plating process, may then be trimmed. The excess plating seed may be trimmed using laser ablation or a mechanical drill prior to the electrolytic copper plating. As a result, the trimmed ledge or shoulder area does not build copper during electrolytic plating and becomes a void, electrically isolating the top and bottom of the area. Next, the two segmented through hole illustrated in FIGS. 16D and 17D may be formed by mechanically drilling twice and then using laser ablation once to trim the ledge 1608 or by mechanically drilling three times. The sequence of the first vertical hole 1602 and the second vertical hole 1604 formation may be interchangeable. The first hole formed may be the second vertical hole 1604 by controlled depth drill while the second hole formed may be the first vertical hole 1602 that is formed by drill. The side of the PCB in which the first vertical hole 1602 is drilled may be the same side as the second vertical hole of hole 1604 is drilled or may be the opposite side.

According to one example, when trimming the ledges, part of the copper plating on the first vertical hole 1602 may be trimmed as well. For example, the part of the copper plating trimmed on the first vertical hole 1602 may be quarter the length of the first vertical hole 1602 or less than a quarter the length of the first vertical hole 1602. According to another example, the part of the copper plating trimmed on the first vertical hole 1602 may be equal to half the length of the first vertical hole 1602 or less than half the length of the first vertical hole 1602.

FIG. 18 (comprising FIGS. 18A-18D) illustrates a four drill step process for forming a three segmented through hole in a PCB, according to one example. FIG. 19 (comprising FIGS. 19A-19D) illustrates cross-sectional views of the stages of the formation of the through hole in FIG. 18. In this example, a first vertical hole 1802, having a diameter d1, is drilled (FIGS. 18A, 19A) through the layers in a PCB (not shown). Next, a pair of vertically aligned holes 1804 and 1806, upper and lower, of a relatively large diameter d2 and d3, respectively, is drilled (FIGS. 18B, 19B) from the upper surface and lower surface of the PCB (not shown). The interior surface of the holes may then be plated 1808 (FIGS. 19C, 19D) with a seed conductive material, such as electroless copper plating. Excess plating seed, which accumulates on the ledge or shoulder formed on the ledge or shoulder 1810 of the through hole during the electroless plating process may be trimmed (FIGS. 18D, 19D) using a laser drill (i.e. laser ablation) or a mechanical drill prior to the electrolytic copper plating. As a result, the trimmed ledge or shoulder area does not build copper during electrolytic plating and becomes a void, electrically isolating the top and bottom of the area. Then, the two segmented through hole illustrated in FIG. 18 may be formed by mechanically drilling three times and then using laser ablation once to trim the ledge 1810 or by mechanically drilling four times. The above described sequence of formation of the first vertical hole 1802, and the pair of vertically aligned holes 1804, 1806, as well as the direction in which the holes are drilled, are by way of example of only. For example, vertically aligned hole 1804 may be the first hole formed, vertically aligned hole 1806 may be the second hole formed, and then the first vertical hole 1802 may be formed by drilling from the side of the PCB in which the vertically aligned hole 1806 is located. According to another example, vertically aligned hole 1804 may be the first hole formed, the first vertical hole 1802 may be the second hole formed (by drilling from the same side of the PCB the vertically aligned hole 1804 is located), and then vertically aligned hole 1806 may be formed.

According to one aspect, when trimming the ledges, part of the copper plating on at least part of the wall between the pair of vertically aligned holes 1804 and 1806 may be trimmed. For example, the part of the copper plating trimmed on the wall between the pair of vertically aligned holes 1804 and 1806 may be quarter the length of wall or less than a quarter the length of the vertical wall. According to another example, the part of the copper plating trimmed on the wall between the pair of vertically aligned holes 1804 and 1806 may be equal to half the length of the wall or less than half the length of the wall.

Figures 20A, 20B, 20C, 20D:
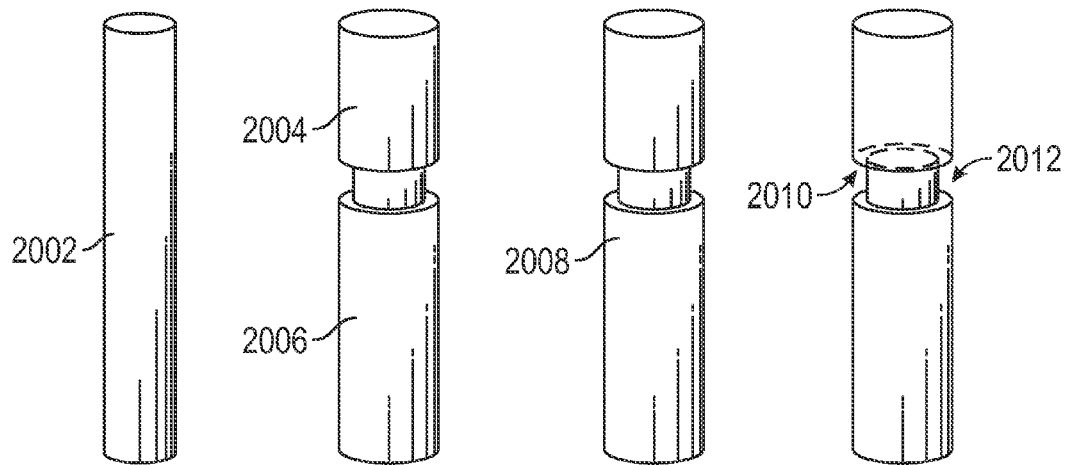
FIG. 20 (comprising FIGS. 20A-20D) illustrates a five drill step process for forming a three segmented through hole in a PCB, according to one example.
Figures 21A, 21B, 21C, 21D:
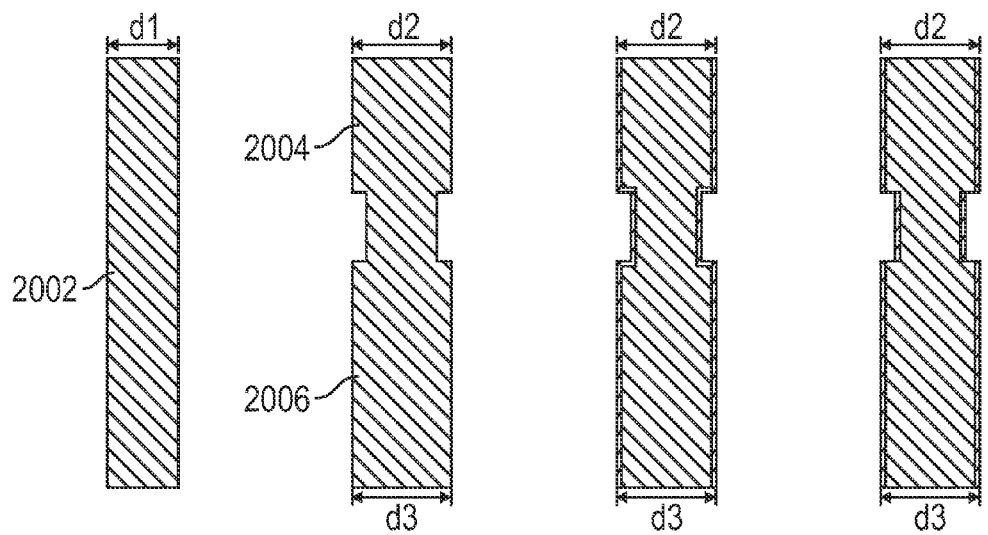
FIG. 21 (comprising FIGS. 21A-21D) illustrates cross-sectional views of the stages of the formation of the through hole in FIG. 20.

FIG. 20 (comprising FIGS. 20A-20D) illustrates a five drill step process for forming a three segmented through hole in a PCB, according to one example. FIG. 21 (comprising FIGS. 21A-21D) illustrates cross-sectional views of the stages of the formation of the through hole in FIG. 20.

In this example, a first vertical hole 2002, having a diameter d1, may be drilled (FIGS. 20A, 21A) through the layers in a PCB (not shown). Next, a pair of vertically aligned holes 2004 and 2006, upper and lower, of a relatively large diameter d2 and d3, respectively, may be drilled (FIGS. 20B, 21B) from the upper surface and lower surface of the PCB (not shown). The interior surface of the holes may then be plated 2008 (FIGS. 20C, 21C) with a seed conductive material, such as electroless copper plating. Excess plating seed, such as a catalyst or electroless copper, may be formed on the ledges or shoulders 2010 and 2012 of the through hole during the electroless plating process. The excess copper plating seed may be trimmed using laser ablation or a mechanical drill prior to the electrolytic copper plating. (FIGS. 20D, 21D) As a result, the trimmed ledge or shoulder area does not build copper during electrolytic plating and becomes a void electrically isolating the top and bottom of the area. Then, the three segmented through hole illustrated in FIG. 20 may be formed by mechanically drilling three times and then using laser ablation twice for trimming the ledges 2010, 2012 or by mechanically drilling five times.

The above described sequence of formation of the first vertical hole 2002, and the pair of vertically aligned holes 2004, 2006, as well as the direction in which the holes are drilled, are by way of example of only. For example, vertically aligned hole 2004 may be the first hole formed, vertically aligned hole 2006 may be the second hole formed, and then the first vertical hole 2002 may be formed by drilling from the side of the PCB in which the vertically aligned hole 2006 is located. According to another example, vertically aligned hole 2004 may be the first hole formed, the first vertical hole 2002 may be the second hole formed (by drilling from the same side of the PCB the vertically aligned hole 2004 is located), and then vertically aligned hole 2006 may be formed.

According to one aspect, when trimming the ledges, part of the copper plating on at least part of the wall between the pair of vertically aligned holes 2004 and 2006 may be trimmed. For example, the part of the copper plating trimmed on the wall between the pair of vertically aligned holes 2004 and 2006 may be quarter the length of wall or less than a quarter the length of the vertical wall. According to another example, the part of the copper plating trimmed on the wall between the pair of vertically aligned holes 2004 and 2006 may be equal to half the length of the wall or less than half the length of the wall.

Figure 22:
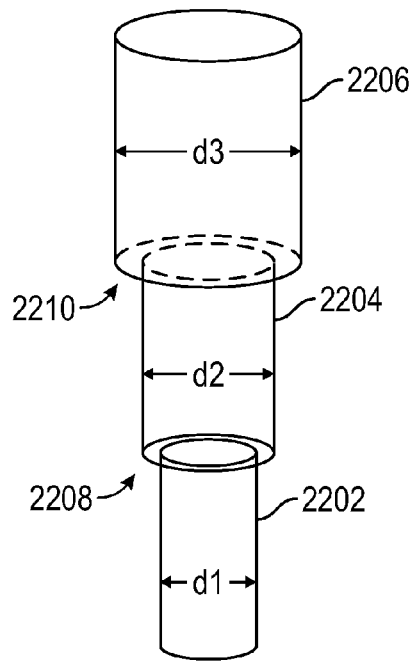
FIG. 22 illustrates another example of a three segmented hole that may be formed with the five drill step process of FIG. 20.

FIG. 22 illustrates another example of a three segmented hole that may be formed with the five drill step process of FIG. 20. Although in the example described below all the drilling of the holes occurs from the same side of the PCB, this is by way of example only and the holes may be drilled from both side of the PCB. A first vertical hole 2202, having a diameter d1 is drilled through the layers in a PCB (not shown). Next, a second vertical hole 2204, having a diameter d2 is drilled through the first vertical hole 2202 and then a third vertical hole 2206 having a diameter d3 is drilled through the first and second vertical holes 2202 and 2204. Diameter d2 may be larger than diameter d1 and diameter d3 may be larger than diameter d2. The interior surface of the holes may then be plated with a seed conductive material, such as electroless copper plating. Excess plating seed, which accumulates on the ledge or shoulder formed on the ledges or shoulders 2208 and 2210 of the through hole during the electroless plating process may each be trimmed using a laser drill (i.e. laser ablation) or a mechanical drill, as described above.

Figure 23:
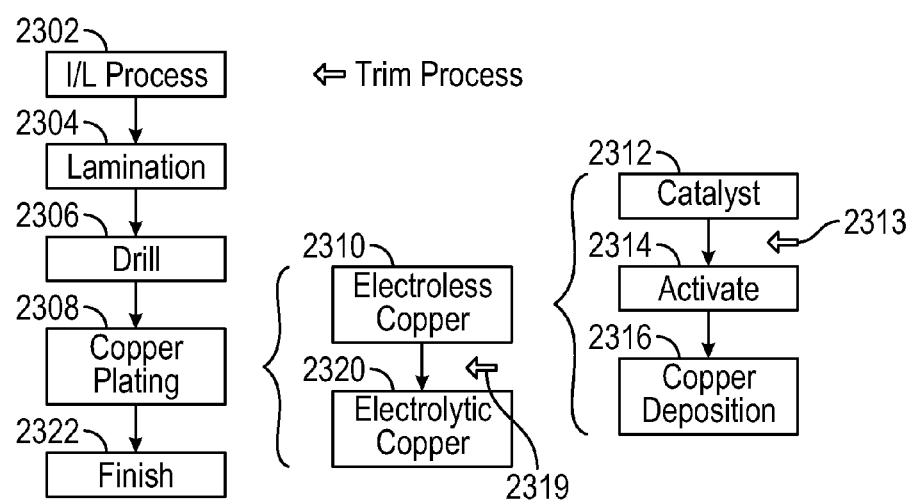
FIG. 23 illustrates a method for forming a printed circuit board (PCB) having one or more through holes, according to one example.

FIG. 23 illustrates a method for forming a printed circuit board (PCB) having one or more through holes, such as the through holes as described above with reference to FIGS. 3, 4, 5, 6, 7, 8, 9, 10, 11, 12 and/or 13. In this method, excess plating material may be trimmed after the catalyst has been applied or after the electroless copper has been applied.

As is known in the art, manufacturing a printed circuit board may include the process of forming a first core or sub-composite structure 2302 which may then be laminated to one or more dielectric layers and/or other core or sub-composite structures 2304. A through hole may then be formed through first core or sub-composite structure, the one or more dielectric layers and the other core or sub-composite structures by drilling 2306. An interior surface of the through hole may be plated with a conductive material, such as copper, to form a plated through hole (PTH) 2308.

To plate the interior surface of the through hole, an electroless copper is applied to the interior surface of the through hole 2310. Applying the electroless copper includes placing the PCB in a seed or catalyzing bath 2312 causing the seed to deposit on the internal surface of the through hole and activating 2314 the catalyst causing copper to be deposited on the interior surface of through hole 2316.

In one embodiment, the excess copper may be trimmed 2313 from the ledges, as described above, after the catalyst has been applied but prior to activating the catalyst. In another embodiment, the excess copper may be trimmed 2319 from the ledges, as described above, after the process of applying electroless copper is complete.

Next, after the electroless copper is applied 2310, the PCB may then be placed into an electrolytic copper plating bath 2320 and copper will plate where there is seed or conductivity. After the electrolytic copper is applied 2320 the process is finished 2322.

Figure 24:
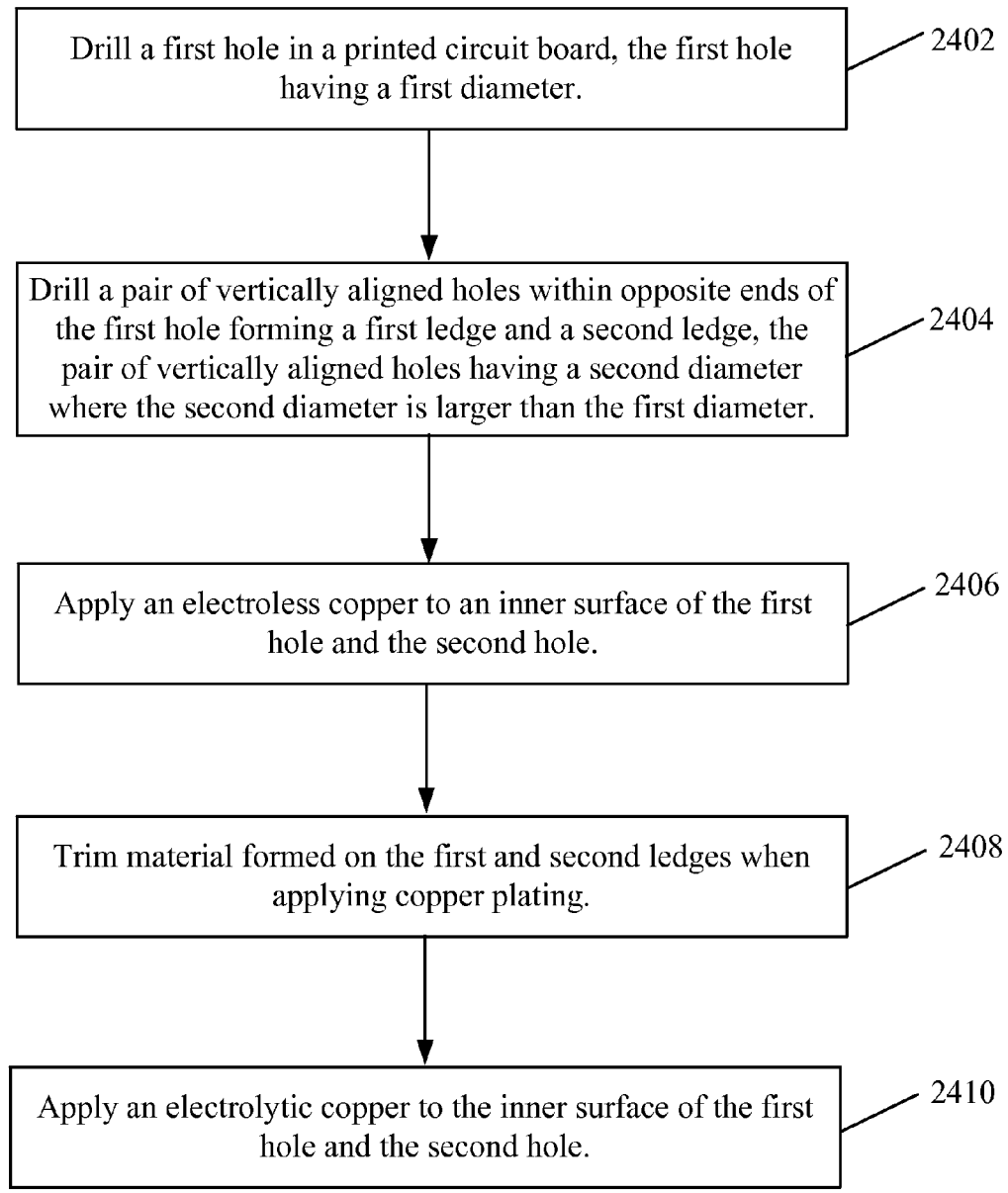
FIG. 24 illustrates a method for making a segmented through hole in printed circuit board using dual diameter through hole edge trimming.

FIG. 24 illustrates a method for making a segmented through hole in printed circuit board using dual diameter through hole edge trimming. In the method, a first hole, having a first diameter, is drilled in a printed circuit board 2402. Next, a pair of vertically aligned holes is drilled within opposite ends of the first hole forming a first ledge and a second ledge, the pair of vertically aligned holes having a second diameter where the second diameter is larger than the first diameter 2404. According to one example, the second diameter may be larger than the first diameter by greater than 25 microns. An electroless copper is then applied to the inner surface of the first hole and the second hole 2406. Next, material formed on the first and second ledges when applying the copper plating is trimmed 2408. The electroless copper may be trimmed using laser ablation or using a mechanical drill. Once the ledge has been trimmed, an electrolytic copper may be applied to the inner surface of the first hole and the second hole 2410.

Applying the electroless copper may include adding a catalyst to the internal surface of the through hole by placing the printed circuit board in a seed or catalyzing bath causing the seed to deposit on the internal surface of the through hole; and activating the catalyst causing copper to be deposited on the interior surface of through hole. According to one embodiment, the electroless copper is trimmed from the ledge after adding the catalyst but before the catalyst is activated. According to another embodiment, the electroless copper is trimmed from the ledge after the catalyst is activated and copper has been deposited.

By trimming the electroless copper from the ledge, copper plating peeling off during the manufacturing process is avoided. That is, the potential of copper lift off as a result of mechanical stress is avoided.

Formation of Generic Through Holes (or Via Structures)—N Drill Step Process

FIG. 25 (comprising FIGS. 25A-25F) illustrates an N drill step process for forming a through hole in a printed circuit board having (N+1)/2 segments, according to one example. FIG. 26 (comprising FIGS. 26A-26F) illustrates cross-sectional views of the stages of the formation of the through hole in FIG. 25.

In the present example, N is an integer and is equal to 7. N is an integer. The steps for forming the through hole are identified by (1a)-(1f) while the cross sectional views of each step are identified as (2a)-(2f).

In this example, a first vertical hole 2502, having a diameter d1, is drilled through the layers in a PCB (not shown). Next, a second vertical hole 2504, having a diameter d2, is drilled through the first vertical hole 2502. Diameter d2 is larger than diameter d1. A third vertical hole 2506, having a diameter d3, is drilled through the first and second vertical holes 2502 and 2504. Diameter d3 may be larger than diameter d2. Next, a fourth vertical hole 2508, vertically aligned with the third hole 2506 and having a diameter d4, may be drilled from the opposite surface in which the first, second and third holes were drilled. The interior surface of the holes may then be plated 2510. Excess copper formed on the ledges or shoulders 2512, 2514 and 2516 of the through hole may each be trimmed using a laser drill (i.e. laser ablation) or a mechanical drill. Excess copper plating seed formed on the ledges or shoulders 2512, 2514 and 2516 of the through hole during electroless plating process may each be trimmed using a laser drill (i.e. laser ablation) or a mechanical drill prior to electrolytic copper plating As a result, the (N+1)/2 segmented through hole illustrated in FIG. 25 may be formed by mechanically drilling (N+1)/2 times plus (N+1)/2−1 using laser ablation or by mechanically drilling N times.

According to one aspect, when trimming the ledges, part of the copper plating on at least part of the vertical wall of the first vertical hole 2502 and the second vertical hole 2504 may be trimmed. For example, the part of the copper plating trimmed on the first vertical hole 2502 and the second vertical hole 2504 may be quarter the length of each of the first vertical hole 2502 and the second vertical hole 2504 or may be less than a quarter the length of each of the vertical wall of the first vertical hole 2502 and the second vertical hole 2504. According to another example, the part of the copper plating trimmed on the first vertical hole 2502 and the second vertical hole 2504 may be may each be equal to half the length of first vertical hole 2502 and the second vertical hole 2504 or may each be less than half the length of the first vertical hole 1802.

In the foregoing specification, embodiments of the invention have been described with reference to numerous specific details that may vary from implementation to implementation. The specification and drawings are, accordingly, to be regarded in an illustrative rather than a restrictive sense. The invention is intended to be as broad as the appended claims, including all equivalents thereto.

Those skilled in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A method for forming a segmented through hole in a printed circuit board using dual diameter through hole edge trimming, comprising:
   drilling a first hole in the printed circuit board, the first hole having a first diameter;
   drilling a second hole within the first hole, the second hole having a second diameter where the second diameter is larger than the first diameter, and where a ledge is formed at a point between an end of the second hole and the first hole;

applying an electroless copper plating to an inner surface of the first hole and the second hole;

trimming material formed on the ledge of the segmented through hole when applying the copper plating; and applying an electrolytic copper to the inner surface of the first hole and the second hole.

2. The method of claim 1, wherein the trimmed material is part of the electroless copper plating; and wherein the trimmed material includes at least part of a vertical wall of the first hole.

3. The method of claim 2, wherein the part of the electroless copper plating is trimmed using laser ablation; and wherein the laser ablation is a conformal mask method or a trepanning method.

4. The method of claim 2, wherein the part of the electroless copper plating is trimmed using a mechanical drill.

5. The method of claim 1, wherein the trimmed material is a catalyst for the electroless copper plating.

6. The method of claim 5, wherein the catalyst is trimmed using laser ablation; and wherein laser ablation is a conformal mask method or a trepanning method.

7. The method of claim 5, wherein the catalyst for the electroless copper plating is trimmed using a mechanical drill.

8. The method of claim 1, wherein application of the electrolytic copper to the inner surface of the first hole and the second hole adds additional material to the ledge; and where the additional material trimmed is the electrolytic copper and is trimmed using laser ablation, a trepanning method or a mechanical drill.

9. The method of claim 8, wherein the laser ablation uses a laser drill having a diameter larger than a minimum diameter of the first hole and smaller than a surface drill diameter of an aperture size of the laser drill.

10. The method of claim 1, wherein a difference of the first hole diameter and the second hole diameter is greater than 25 microns.

* * * * *